United States Patent
Hachtmann et al.

(10) Patent No.: US 9,530,926 B2
(45) Date of Patent: Dec. 27, 2016

(54) AUTOMATED FLEXIBLE SOLAR CELL FABRICATION AND INTERCONNECTION UTILIZING ROLLS EXPANDED METALLIC MESH

(71) Applicant: NUVOSUN, INC., Milpitas, CA (US)

(72) Inventors: Bruce D. Hachtmann, San Martin, CA (US); Christine Tsai, San Jose, CA (US); Thomas M. Valeri, Gilroy, CA (US); Herb Delarosa, Fremont, CA (US)

(73) Assignee: Nuvosun, Inc., Milpitas, CA (US)

( * ) Notice: Subject to any disclaimer, the term of this patent is extended or adjusted under 35 U.S.C. 154(b) by 170 days.

(21) Appl. No.: 14/362,296

(22) PCT Filed: Dec. 6, 2012

(86) PCT No.: PCT/US2012/068302
§ 371 (c)(1),
(2) Date: Jun. 2, 2014

(87) PCT Pub. No.: WO2013/086233
PCT Pub. Date: Jun. 13, 2013

(65) Prior Publication Data
US 2014/0352777 A1    Dec. 4, 2014

Related U.S. Application Data

(60) Provisional application No. 61/568,134, filed on Dec. 7, 2011.

(51) Int. Cl.
*H01L 31/05*    (2014.01)
*H01L 31/18*    (2006.01)
(Continued)

(52) U.S. Cl.
CPC ..... *H01L 31/206* (2013.01); *H01L 31/022433* (2013.01); *H01L 31/03926* (2013.01);
(Continued)

(58) Field of Classification Search
CPC ............... H01L 31/022425; H01L 31/0392; H01L 31/206
(Continued)

(56) References Cited

U.S. PATENT DOCUMENTS 3,375,141 A     3/1968  Julius
3,442,007 A  *  5/1969  Humrick ........... H01L 31/02242
                                                  136/256
(Continued)

FOREIGN PATENT DOCUMENTS

DE      4018013      12/1991
EP      1603169      7/2005
(Continued)

OTHER PUBLICATIONS

Supplementary European Search Report, Application No. 12855901.0, mailed Jul. 6, 2015.
(Continued)

*Primary Examiner* — Victor A Mandala
*Assistant Examiner* — Regan J Rundio
(74) *Attorney, Agent, or Firm* — McDonnell Boehnen Hulbert & Berghoff LLP (57) ABSTRACT

A method for forming photovoltaic cells comprises providing a first roll of a photovoltaic material and a second roll of an expanded metallic mesh. The photovoltaic material comprises a photoactive material adjacent to a flexible substrate, and the expanded metallic mesh comprises a plurality of openings. Next, an electrically insulating material is provided adjacent to an edge portion of the photovoltaic material. The photovoltaic material from the first roll can then be (Continued)

brought in proximity to the expanded mesh from the second roll to form a nascent photovoltaic cell. The electrically insulating material can be disposed between the expanded metallic mesh and the photovoltaic material. Next, the nascent photovoltaic cell is cut into individual sections to form a plurality of photovoltaic cells.

4 Claims, 8 Drawing Sheets (51) Int. Cl.
    *H01L 31/042*     (2014.01)
    *H01L 31/048*     (2014.01)
    *H01L 31/0224*     (2006.01)
    *B32B 37/10*     (2006.01)
    *H01L 31/20*     (2006.01)
    *H01L 31/0465*     (2014.01)
    *H01L 31/0445*     (2014.01)
    *H01L 31/0392*     (2006.01)
    *H01L 31/032*     (2006.01)

(52) U.S. Cl.
    CPC ........ *H01L 31/048* (2013.01); *H01L 31/0445* (2014.12); *H01L 31/0465* (2014.12); *H01L 31/0504* (2013.01); *H01L 31/0508* (2013.01); *H01L 31/0516* (2013.01); *H01L 31/18* (2013.01); *H01L 31/1876* (2013.01); *H01L 31/1884* (2013.01); *B32B 37/1018* (2013.01); *B32B 2457/12* (2013.01); *H01L 31/0322* (2013.01); *H01L 31/0392* (2013.01); *H01L 31/03921* (2013.01); *H01L 31/03923* (2013.01); *H01L 31/03925* (2013.01); *Y02E 10/50* (2013.01); *Y02P 70/521* (2015.11); *Y10T 156/1097* (2015.01); *Y10T 156/1098* (2015.01)

(58) Field of Classification Search
    USPC ..................................................... 438/62, 68
    See application file for complete search history.

(56) References Cited

U.S. PATENT DOCUMENTS

| | | | |
|---|---|---|---|
| 4,260,429 A | 4/1981 | Moyer | |
| 4,283,591 A | 8/1981 | Boer | |
| 4,328,293 A | 5/1982 | Lisse | |
| 4,450,033 A | 5/1984 | Little | |
| 4,652,693 A | 3/1987 | Bar-On | |
| 4,685,608 A | 8/1987 | Kujas | |
| 5,100,808 A | 3/1992 | Glenn | |
| 5,158,618 A | 10/1992 | Rubin | |
| 5,273,608 A * | 12/1993 | Nath | C09J 5/06 |
| | | | 136/245 |
| 5,378,639 A | 1/1995 | Sasaki et al. | |
| 5,474,621 A | 12/1995 | Barnard | |
| 5,474,622 A | 12/1995 | Negami et al. | |
| 6,313,396 B1 | 11/2001 | Glenn | |
| 6,316,832 B1 | 11/2001 | Tsuzuki | |
| 6,414,235 B1 | 7/2002 | Luch | |
| 6,472,594 B1 | 10/2002 | Ichinose et al. | |
| 6,531,653 B1 | 3/2003 | Glenn et al. | |
| 6,936,761 B2 * | 8/2005 | Pichler | G02F 1/155 |
| | | | 136/252 |
| 7,829,781 B2 | 11/2010 | Montello et al. | |
| 2001/0004901 A1 | 6/2001 | Yamanaka et al. | |
| 2001/0050102 A1 | 12/2001 | Matsumi et al. | |
| 2003/0230337 A1 | 12/2003 | Gaudiana et al. | |
| 2005/0005964 A1 | 1/2005 | Komatsu | |
| 2005/0263180 A1 * | 12/2005 | Montello | H01G 9/2027 |
| | | | 136/244 |
| 2006/0231837 A1 | 10/2006 | Wuchse et al. | |
| 2007/0065962 A1 | 3/2007 | Pichler | |
| 2007/0138890 A1 | 6/2007 | Yu | |
| 2008/0196756 A1 | 8/2008 | Basol | |
| 2008/0227236 A1 | 9/2008 | Luch | |
| 2009/0014057 A1 | 1/2009 | Croft et al. | |
| 2009/0111206 A1 | 4/2009 | Luch | |
| 2009/0173374 A1 | 7/2009 | Luch | |
| 2009/0178702 A1 | 7/2009 | Pichler | |
| 2009/0266579 A1 | 10/2009 | Hofmuller | |
| 2009/0308430 A1 | 12/2009 | Everett et al. | |
| 2009/0318037 A1 | 12/2009 | Wirth | |
| 2010/0043863 A1 | 2/2010 | Wudu et al. | |
| 2010/0108141 A1 | 5/2010 | Fukushima | |
| 2010/0116310 A1 | 5/2010 | Shimizu et al. | |
| 2010/0212718 A1 | 8/2010 | Houghton | |
| 2010/0226629 A1 | 9/2010 | Basol et al. | |
| 2011/0056537 A1 * | 3/2011 | Luch | H01L 31/0465 |
| | | | 136/244 |
| 2011/0070678 A1 | 3/2011 | Luch | |
| 2011/0223776 A1 | 9/2011 | Ferber | |
| 2012/0000502 A1 * | 1/2012 | Wiedeman | H01L 31/048 |
| | | | 136/244 |

FOREIGN PATENT DOCUMENTS

| | | |
|---|---|---|
| JP | S59-115576 | 4/1984 |
| JP | S62016579 | 1/1987 |
| JP | H04298082 | 10/1992 |
| JP | H06-151915 | 5/1994 |
| JP | H09-18040 | 1/1997 |
| JP | H10-051018 | 2/1998 |
| JP | 2001-082058 | 3/2001 |
| JP | 2002-252362 | 9/2002 |
| JP | 2005-123445 | 5/2005 |
| JP | 2006-012802 | 1/2006 |
| JP | 2008509564 | 3/2008 |
| JP | 2008294383 | 12/2008 |
| WO | 2006015430 | 2/2006 |
| WO | 2009158408 | 12/2009 |
| WO | 2011/147388 | 12/2011 |

OTHER PUBLICATIONS

Search Report and Written Opinion, International Application No. PCT/US2011/038887, mailed Jan. 2, 2012.
Taiwanese Search Report, Application No. 100119695, dated Nov. 3, 2015.
Supplemental EP Search Report, Application No. PCT/US2011038887, mailed Mar. 25, 2014.
Chinese Search Report, Application No. 201280069140.3, dated Sep. 21, 2015.
The International Search Report (ISR) with Written Opinion for PCT/US2012/068302 dated Mar. 28, 2013.
The International Preliminary Report on Patentability (IPRP) for PCT/US2012/068302 dated Feb. 21, 2014.

* cited by examiner

AUTOMATED FLEXIBLE SOLAR CELL FABRICATION AND INTERCONNECTION UTILIZING ROLLS EXPANDED METALLIC MESH

CROSS-REFERENCE

This application is a national stage application of International Patent Application No. PCT/US2012/068302 ("AUTOMATED FLEXIBLE SOLAR CELL FABRICATION AND INTERCONNECTION UTILIZING ROLLS EXPANDED METALLIC MESH"), filed Dec. 6, 2012, which in turn claims priority to U.S. Provisional Patent Application No. 61/568,134, filed Dec. 7, 2011, which are entirely incorporated herein by reference.

BACKGROUND

Amorphous silicon, copper indium gallium diselenide (CIGS), and cadmium telluride (CdTe) are the only thin film solar cells that are being produced in commercial scale today. Thin film solar cells on flexible substrates that are currently available include amorphous silicon on a thin metal foil (usually stainless steel) and CIGS on metallic or polyimide foils. To date, thin film cadmium telluride solar cells are produced only on glass, but work is being done on a flexible substrate. Other types of solar cell materials suitable for use on flexible substrates may become available. For example work is being carried out on a variant of CIGS that utilizes zinc and tin instead of indium and gallium, as well as continuing research on organic and dye sensitized solar cell materials.

SUMMARY

This disclosure provides an automated method for fabricating solar cells from rolls of flexible thin film solar cell material, and electrically interconnecting the cells to form strings which can be used to form solar modules.

This disclosure provides a highly automated method for the fabrication of individual thin film solar cells from large rolls of flexible solar cell material. This disclosure also provides a current collection grid pattern and interconnects through the use of an inexpensive flat expanded metallic mesh.

An aspect of the disclosure provides a method for forming a photovoltaic module, comprising providing a first photovoltaic cell and a second photovoltaic cell. An individual photovoltaic cell of the first and second photovoltaic cells comprises an expanded metallic mesh that is disposed adjacent to a flexible thin film photoactive device, and an electrically insulating material disposed between the expanded metallic mesh and the flexible thin film photovoltaic device at an edge portion of the flexible thin film photoactive device. Next, an expanded metallic mesh of the first photovoltaic cell is brought in contact with an underside of the second photovoltaic cell, thereby electrically connecting the thin film photoactive devices of the photovoltaic cells to form the photovoltaic module.

Another aspect of the disclosure provides a method for forming photovoltaic cells, comprising providing a first roll of a photovoltaic material and a second roll of an expanded metallic mesh. The photovoltaic material comprises a photoactive material adjacent to a flexible substrate, and wherein the expanded metallic mesh comprises a plurality of openings. Next, an electrically insulating material is provided adjacent to an edge portion of the photovoltaic material. The photovoltaic material from the first roll is brought in proximity to the expanded metallic mesh from the second roll to form a nascent photovoltaic cell. The electrically insulating material is disposed between the expanded metallic mesh and the photovoltaic material. Next, the nascent photovoltaic cell is cut into individual sections to form a plurality of photovoltaic cells.

Another aspect of the disclosure provides a photovoltaic cell, comprising a photovoltaic device comprising a flexible substrate adjacent to a photoactive material, and an expanded metallic mesh adjacent to the photovoltaic device. The expanded metallic mesh comprises a plurality of holes for permitting electromagnetic radiation to come in contact with the photoactive material. The photovoltaic cell further comprises an electrically insulating material disposed between the expanded metallic mesh and the photovoltaic device at an edge portion of the photovoltaic device.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the claimed invention are set forth with particularity in the appended claims. A better understanding of the features and advantages of the present invention will be obtained by reference to the following detailed description that sets forth illustrative embodiments, in which the principles of the invention are utilized, and the accompanying drawings or figures (also "FIG." or "FIGS." herein) of which:

DETAILED DESCRIPTION

While preferable embodiments of the invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein can be employed in practicing the invention.

The terms "photovoltaic cell" (also "solar cell" herein), as used herein, generally refers to a device comprising a photovoltaic device comprising a photoactive material (or absorber) that is configured to generate electrons and holes (or electricity) upon exposure of the device to electromagnetic radiation (or energy), or a given wavelength or distribution of wavelengths of electromagnetic radiation. A photovoltaic device can include a substrate adjacent to the photoactive material.

The term "photovoltaic module," as used herein, generally refers to a device comprising one or more photovoltaic cells.

To be useful in a solar power system, any of the various types of solar cells (also "cells" herein") may be electrically interconnected serially with other similar solar cells to raise the voltage levels and minimize resistive losses that would otherwise occur due to high currents. Cells deposited on large rigid sheets of may use a system of scribes applied between different process steps and at specific locations to create a serial interconnection of the cells over the entire sheet. This procedure is sometimes referred to as "monolithic integration," and it utilizes the top conductive oxide (TCO) as the current carrier instead of a metallic grid common to silicon cells. Even though it eliminates the grid, recognized herein are a number of disadvantages with the method, and in any case, it is difficult and expensive to implement on flexible substrates because of the accuracy required for both the placement and the depth of the scribes. Additionally, flexible substrates enable roll to roll processing which could become less desirable economically if the process had to be interrupted to implement the scribing operations, even if those operations could be adequately and economically accomplished.

Conventional crystalline or polycrystalline silicon solar cells are formed on individual wafers, which then may be interconnected. Current collecting grids and buss bars are typically formed by screen printing a pattern with silver bearing inks that are subsequently cured at high temperatures (on the order of 700° C.). Silicon cells have an antireflection coating formed of silicon nitride which is transparent but non-conducting. During the curing stage, the silver penetrates the silicon nitride coating and makes an ohmic contact to the silicon cell. The usual grid pattern includes a series of fine straight and parallel lines spaced two to three millimeters apart with two or three wider lines (buss bars) running perpendicular to the pattern of fine lines. The resulting structure provides a surface on the buss bars to which interconnecting "Z" tabs can be attached by conventional soldering methods. Upon exposure of the cell to light, cell current is collected locally by the narrow grids and transmitted to the relatively wider buss bars which then become the connection points to the next cell. The "Z" tab structure provides a flexible interconnection between cells which helps reduce damage due to thermal expansion and contraction during use. An advantage of this method over monolithic integration is that the cells can be tested and sorted for performance prior to module assembly. In this way, the overall module performance is not limited by the lowest performing cell in the string, which can be a problem for monolithic integration.

The screen printing process used for silicon cells, however, has met with only limited success when applied to thin film flexible solar cells. Two problems are generally encountered which limit the performance of the cell, as recognized herein. The first problem has to do with temperature. Thin film cells cannot survive the same high temperatures needed to cure the silver inks used on silicon cells. As a result of lower curing temperatures, some of the ink carriers and solvents remain in the grid line structure causing the metallic particles not to be well fused together. Even though newer inks are being developed which can be cured more completely at lower temperatures, this mechanism still lowers the conductivity of the grid lines and buss bars, and limits the ability to solder connecting ribbons to the printed buss bars. Alternatively, the interconnection between cells may be made with silver doped conductive epoxies, but it is generally inferior to soldering and it typically incurs additional curing time. In addition, the recent increase in the price of silver has made the process economically less desirable.

Secondly, since the surface finish of metallic flexible substrates is normally much rougher than that of glass or silicon wafers, many more defects exist which can become potential shunt sites if conductive inks are allowed to flow into them. This problem can be somewhat mitigated by first printing a much less conductive material, like a carbon based ink, to initially fill any defects, and then over printing with the silver inks. Consistently good results are difficult to achieve, since anything short of perfect printing registration causes extra shading loss as well as increased potential shunting. In addition, the cost of the materials and equipment is relatively high and automation is difficult due to the large scale printing and curing processes as well as the high mechanical tolerance requirements.

Photovoltaic Modules

This disclosure provides rolls of flexible thin film solar (or photovoltaic) cells that can be used in a substantially automated process to create individual cells that are then interconnected to form modules. Printing using silver based inks, potential shunting, precision print pattern registration, and long hot curing times can be avoided by the use of a flat expanded metallic mesh that has superior conductivity to silver printed ink patterns, is faster to apply, and is much more economical to implement.

In some embodiments, a photovoltaic cell comprises a photovoltaic device comprising a flexible substrate adjacent to a photoactive material, and expanded metallic mesh adjacent to the photovoltaic device. The photovoltaic device can be a flexible thin film photovoltaic device. The expanded metallic mesh comprises a plurality of holes (or openings) for permitting electromagnetic radiation to come in contact with the photoactive material. The photovoltaic cell can further comprise an electrically insulating material disposed between the expanded metallic mesh and the photovoltaic device at an edge portion of the photovoltaic device. The electrically insulating material can be optically transparent.

An opening of the expanded metallic mesh can have any shape, size, or configuration. An opening can have a circular, triangular, square, rectangular, pentagonal, hexagonal, heptagonal, octagonal, or nonagonal, or any partial shape (e.g., semi-circular) or combination thereof.

The photoactive material can be an absorbed that is configured to generate electrons and holes upon exposure to electromagnetic radiation (or light). The metallic mesh can be adapted to collect and conduct electrons out of the photovoltaic device and to a load, such as, for example, an energy storage system (e.g., battery), an electrical grid, or an electronic device or system.

The photoactive material can be formed of various materials. Examples of photoactive materials include, without limitation, amorphous silicon, copper indium gallium diselenide (CIGS), cadmium telluride (CdTe) and CdZnTe/CdTe.

In some cases, the photovoltaic cell further comprises an optically transparent film that secures the metallic mesh to the photovoltaic device. The optically transparent film can be a pressure sensitive adhesive. As an alternative, the expanded metallic mesh can be secured to the photovoltaic device by a conductive epoxy. As another alternative, the expanded metallic mesh can be attached to the photovoltaic device by a low melting point solder.

The expanded metallic mesh can have various shapes, sizes and configurations. A width of the expanded metallic mesh can be from about 1 inch to 10 inches, or 1.5 inches to 6.0 inches. A thickness of the expanded metallic mesh can be from about 0.001 inches to 0.05 inches, or 0.002 inches to 0.01 inches. In some cases, the expanded metallic mesh comprises individual wire-like elements, each having a width from about 0.001 inches to 0.01 inches, or 0.002 inches to 0.006 inches.

The expanded metallic mesh can be formed of a metallic material, such as copper, iron, tin, nickel, gold, silver, platinum, palladium, chromium, tungsten, titanium, tantalum, or any combination thereof. In some cases, the expanded metallic mesh is formed of a polymeric material that is coated with a metallic material. For example, the expanded metallic mesh can include a polymeric core and a metallic shell. In some cases, the expanded metallic mesh can include one or more coatings. The one or more coatings can comprise nickel and/or tin.

The flexible substrate can include stainless steel, aluminum, or a polymeric material. The photovoltaic device can have a thickness from about 1 inch to 10 inches, or 1.5 inches to 6.0 inches.

In some cases, a photovoltaic module comprises a plurality of photovoltaic cells. The plurality of photovoltaic cells can be in electrical contact with one another in series (i.e., serial configuration). In some examples, a metallic mesh of one photovoltaic cell is in electrical contact with an underside of an adjacent photovoltaic cell. Photovoltaic cells can be disposed adjacent to one another in a "string" of photovoltaic cells.

Reference will not be made to the figures, wherein like numerals refer to like parts throughout. It will be appreciated that the figures and structures therein are not necessarily drawn to scale.

Figure 1:
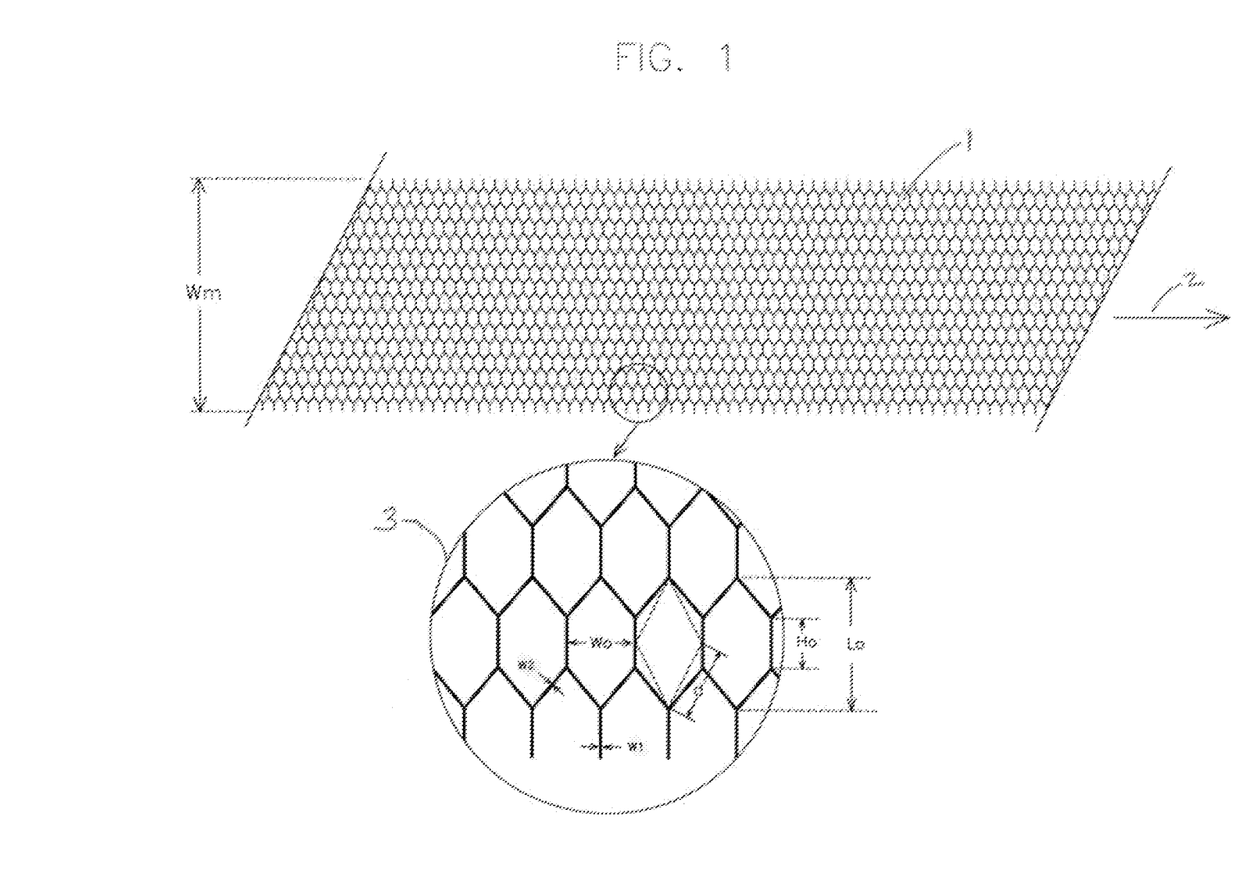
FIG. 1 is a schematic diagram illustrating the properties of a flat expanded metallic mesh suitable for making a current collecting grid and interconnect means for flexible thin film solar cells.

FIG. 1 illustrates the geometry of a section of a flat expanded metallic mesh 1. The metallic mesh 1 can be mounted on photovoltaic device to form a solar cell. The mesh 1 has width Wm and has a substantially long length in the direction of arrow 2. The mesh can be formed of a roll of metallic foil that is slightly wider than the width of the finished mesh. The foil is slit, expanded, and flattened to produce a roll of mesh from the input roll of foil. Expanded view 3 illustrates the details of the mesh geometry. In general an opening in the mesh has a width Wo, a length Lo, and a side height Ho. Ho can be on the order of ⅓ to ½ of Lo, so the opening resembles an elongated hexagon, but Ho can be zero. In that case the mesh opening takes the form of a diamond (dashed lines) with sides of length d. If the expansion of the metal is continued until Wo is equal to Lo, then the openings can be more symmetrical, and if Ho also approaches zero the diamonds can be squares. Practical dimensions for the mesh openings are fractions of a centimeter. For example Lo may be on the order 9 millimeters while Wo is 4 millimeters to 5 millimeters.

An opening of the mesh can have any shape, size, or configuration. An opening can have a circular, triangular, square, rectangular, pentagonal, hexagonal, heptagonal, octagonal, or nonagonal, or any partial shape (e.g., semi-circular) or combination thereof.

The mesh 1 can be formed of a metallic material, such as copper, iron, tin, nickel, gold, silver, platinum, palladium, chromium, tungsten, titanium, tantalum, or any combination thereof. In some examples, the mesh 1 can be formed of a polymeric material and coated with a metallic material.

While any of the possible shapes for the mesh opening can be useful for forming the current collecting grid on a solar (or photovoltaic) cell, there are some optimizations that can be made. The width of the rectangular cross sectional "wires" that make up the mesh can be controlled by the distance between the slits and the amount of expansion that can be employed. In view 3 of FIG. 1 the width W1 is can be determined by the distance between the slits, and the width W2 can be determined by the amount of expansion. W2 can be less than W1 if before expansion all of the distances between the slits are the same. A typical dimension for W1 is of the order of a few thousandths of an inch. For the asymmetrical pattern shown in FIG. 1 the resistance across the width of the mesh can be lower than that for an equal distance down the length of the mesh. Therefore, for a given obstruction of sunlight by the mesh (4% or 5%, for example), the mesh geometry can be optimized for low resistance across the cell and enable automated assembly from rolls of material. The mesh can be coated with other materials either before or after the expansion. For example the mesh can be formed of copper and plated with tin for improved environmental performance, and it can receive a thin layer of low melting solder on one or both sides for a subsequent bonding operation. Many embodiments are possible.

Figure 2A:
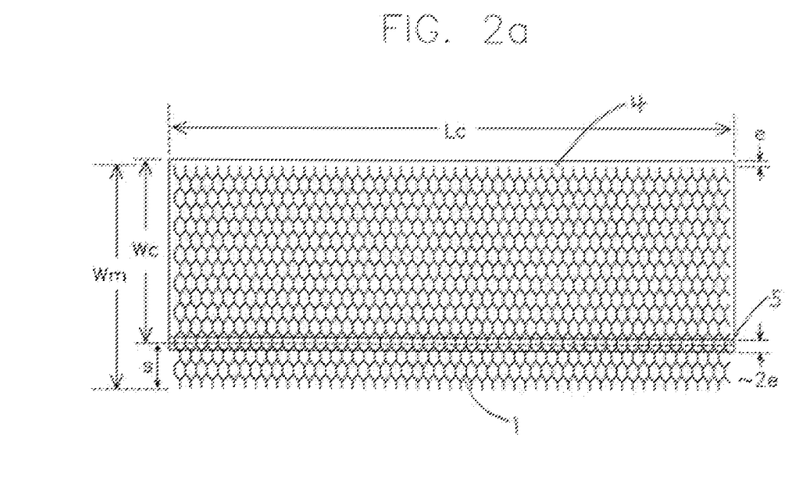
FIG. 2a is a schematic diagram showing a planar view of the geometry of a finished thin film solar cell using a section of the flat expanded metallic mesh described in FIG. 1.
Figure 2B:
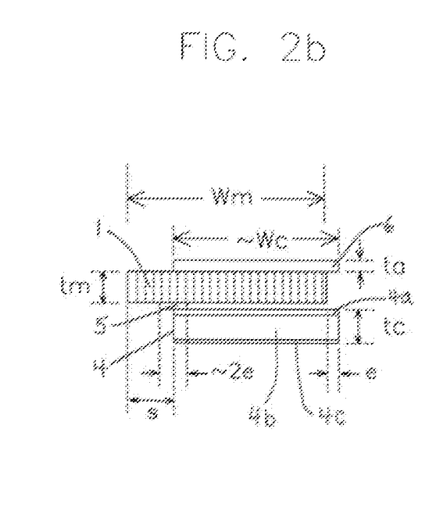
FIG. 2b is a cross-sectional schematic diagram in exaggerated thickness scale showing the geometry of a finished thin film solar cell using a section of the flat expanded metallic mesh described in FIG. 1.

FIGS. 2a and 2b show a finished photovoltaic cell. A method of producing an individual cell from rolls of materials can be described by way of an example of a machine that performs the described functions. The serial interconnection of the cells into strings and the strings into modules is provided herein.

A planar view of an individual photovoltaic cell is shown in FIG. 2a. The active photovoltaic (or solar) device 4 (also "device" herein) has width Wc and length Lc. It is a section cut from a reel of flexible photovoltaic material that has a width Wc and some arbitrarily longer length. A section of mesh 1 with width Wm as shown in FIG. 1 can be applied over device 4. The mesh 1 extends over only a one edge of the device 4, but not both. On a left side of the device 4 the mesh 1 is short (from an edge of the device 4) by an amount "e" that has dimensions from about 1 to 3 millimeters (i.e., a fraction of the mesh opening), for example. The mesh overlaps one long side of the device 4 by an amount "s" which can be a few multiples Lo, such as, for example, at least 1.1, 1.2, 1.3, 1.4, 1.5, 2, 3, 4, 5, 6, 7, 8, 9, or 10 multiples of Lo. The mesh can cause electrical shorts or shunts at the edge of the device 4 along the overlapped region. This is prevented by the prior application of a thin strip 5 of insulating transparent pressure sensitive adhesive (PSA) of width approximately 2e, about half of which can be adhered to the edge of the device 4 as shown. The mesh 1 can be attached to the device 4 by way of a securing member, such as PSA or a temperature sensitive transparent tape whose size can be about the same as that of the mesh minus the overhang region s. The mesh 1 can include individual wire-like elements, each having a width from about 0.001 inches to 0.01 inches, or 0.002 inches to 0.006 inches.

FIG. 2b is a schematic diagram of the cross section of the photovoltaic cell of FIG. 2a. The photovoltaic device 4 includes at least three parts: the photoactive cell (or material) 4a, the electrically conductive flexible substrate 4b, and, in some cases, a reverse side coating 4c. If photoactive cell 4a is a CIGS cell, it can be as described in U.S. Pat. No. 5,626,688 to Probst et al., U.S. Pat. No. 6,040,521 to Kushiya et al., and U.S. Pat. No. 8,021,905 to Nath et al., each of which is entirely incorporated herein by reference. The total thickness of the photoactive cell 4a can be on the order of a few nanometers to micrometers. Substrate 4b can be formed of stainless steel or other metallic foil. Substrate 4b can be electrically conductive and serve as an extension of the back electrode of photoactive cell 4a to function properly in the automated processes described herein. In some examples, the thickness of the flexible substrate 4b can range from approximately one thousandth of an inch (about 25 micrometers) to a few thousandths of an inch. Reverse side coating 4c is a thin metal coating (about a micrometer or less) used to provide galvanic compatibility with the mesh interconnection between adjacent cells. As an example, the mesh could be made from copper and plated with a thin coating of tin. In such a case coating 4c also could be tin, although the structure could function for an extended period of time without coating 4c under optimal environmental packaging conditions, such as, for example, if the cell is packaged under vacuum or in an inert (e.g., Ar, He) environment. The flexible photovoltaic device 4 has a thickness tc that is dependent on the thickness of each of the call 4a, substrate 4b and coating. In some examples, the substrate 4b can have a thickness from about 0.001 inches to 0.01 inches, or 0.002 inches to 0.005 inches.

The transparent insulating strip 5 applied along the edge of one long side of the device 4 can prevent the overhanging area s of the mesh 1 from causing shunts along the edge of the device 4. The thickness tm of the mesh 1 can be varied to obtain adequately low electrical resistance while minimizing shading loss; however, in some cases, tm is from about tc up to about 2×tc. The mesh 1 can be held against the device 4 by transparent tape 6 (e.g., PSA) whose width is approximately equal to Wc, and whose thickness to can be on the order of a few thousandths of an inch. In FIG. 2b, on the edge where the mesh 1 does not overhang the device 4, tape 6 is shown overhanging the edge of the mesh 1 by a distance e; however, this is not a critical dimension. The tape can cover the mesh 1 on this side, but not extend past the edge of the device 4 on either side, so there is a relatively wide tolerance.

Systems and Methods for Forming Photovoltaic Cells and Modules

This disclosure provides methods for forming photovoltaic cells and modules. The methods can be at least partially or fully automated. In some cases, a photovoltaic cell is formed by bringing materials together in a roller-implemented process.

In some embodiments, a method for forming a photovoltaic cell comprises providing a first roll of a photovoltaic material and a second roll of an expanded metallic mesh. The photovoltaic material comprises a photoactive material adjacent to a flexible substrate, and the expanded metallic mesh comprises a plurality of openings. Next, an electrically insulating material is provided adjacent to an edge portion of the photovoltaic material. The photovoltaic material from the first roll is then brought in proximity to the expanded metallic mesh from the second roll to form a nascent photovoltaic cell. The electrically insulating material can be disposed between the expanded metallic mesh and the photovoltaic material. Next, the nascent photovoltaic cell is cut into individual sections to form a plurality of photovoltaic cells.

Figure 3:
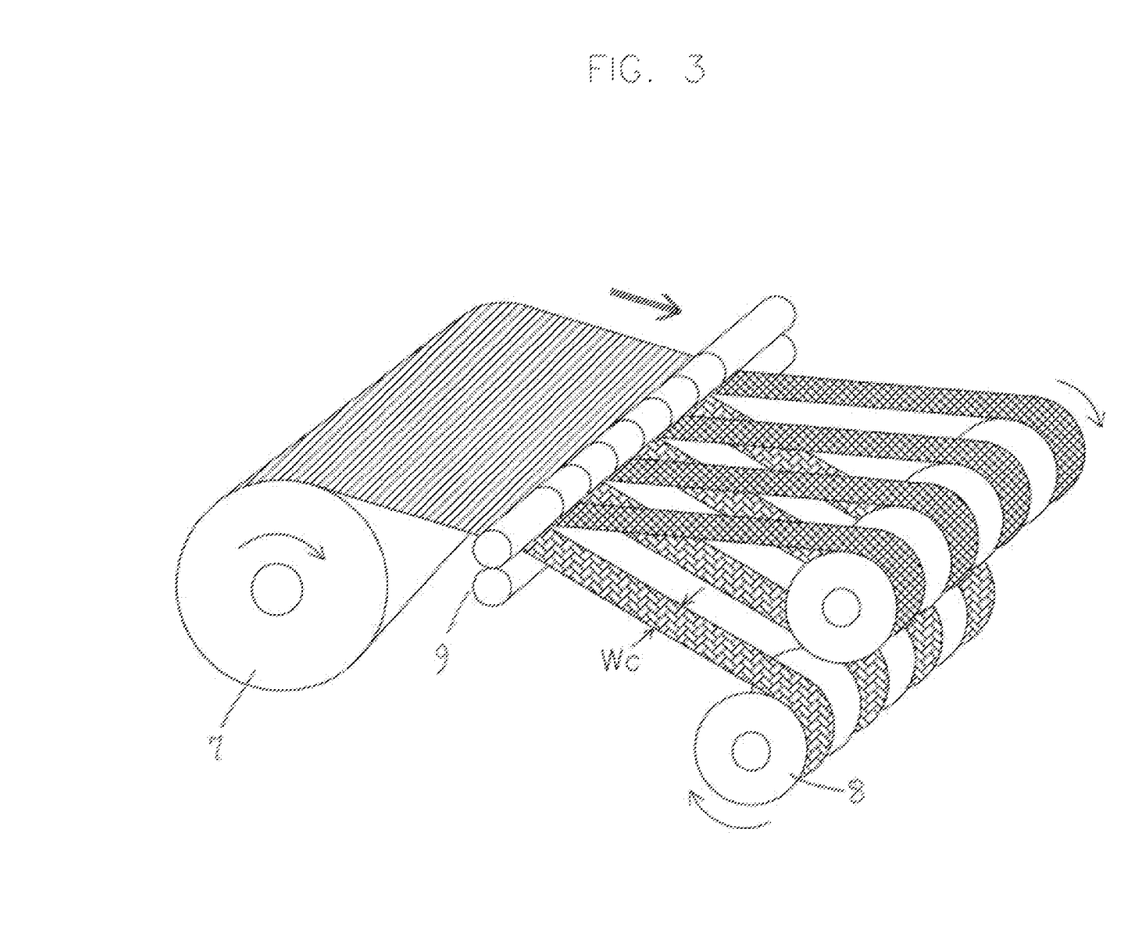
FIG. 3 is a schematic diagram depicting a perspective view of the initial step of creating reels of flexible solar cell material by automatically slitting them from a much larger roll of finished solar cell stock.

A method for forming a photovoltaic cell can be fully automated, and in some cases regulated by a computer system having one or more computer processors that are programmed to implement the method. The automated operations used in the method to make the individual photovoltaic cells can begin with the formation of reels of photovoltaic (cell) material from much larger rolls of flexible photovoltaic cell material. The photovoltaic material comprises photoactive material (e.g., CIGS, CdTe), and in some cases a substrate, such as a flexible substrate. This process is schematically illustrated in FIG. 3 which shows that a large roll of photovoltaic cell material 7 is being slit into smaller reels 8. The large roll can include any solar cell material, such as CIGS. The photovoltaic cell material 7 can be the photovoltaic cell 4 described elsewhere herein. The slitting is accomplished by a set of rotary cutting members 9 (e.g., knives, blades) that can be adjusted to produce reel 8 of various widths Wc. In some cases, the weight of each reel 8 can be limited to what an average worker can conveniently handle by hand, such as, for example, on the order of 40 pounds to 50 pounds. Several reels 8 can be produced at each position from the much larger roll 7. The slitting operation can be substantially fast compared to the process of producing the initial large roll, so one slitting machine can handle the capacity of several manufacturing lines making the cell material. Large numbers of reels maybe stored for relatively long periods of time, and they can be shipped to alternative finishing sites for conversion into individual photovoltaic cells and subsequent modules.

Figure 4:
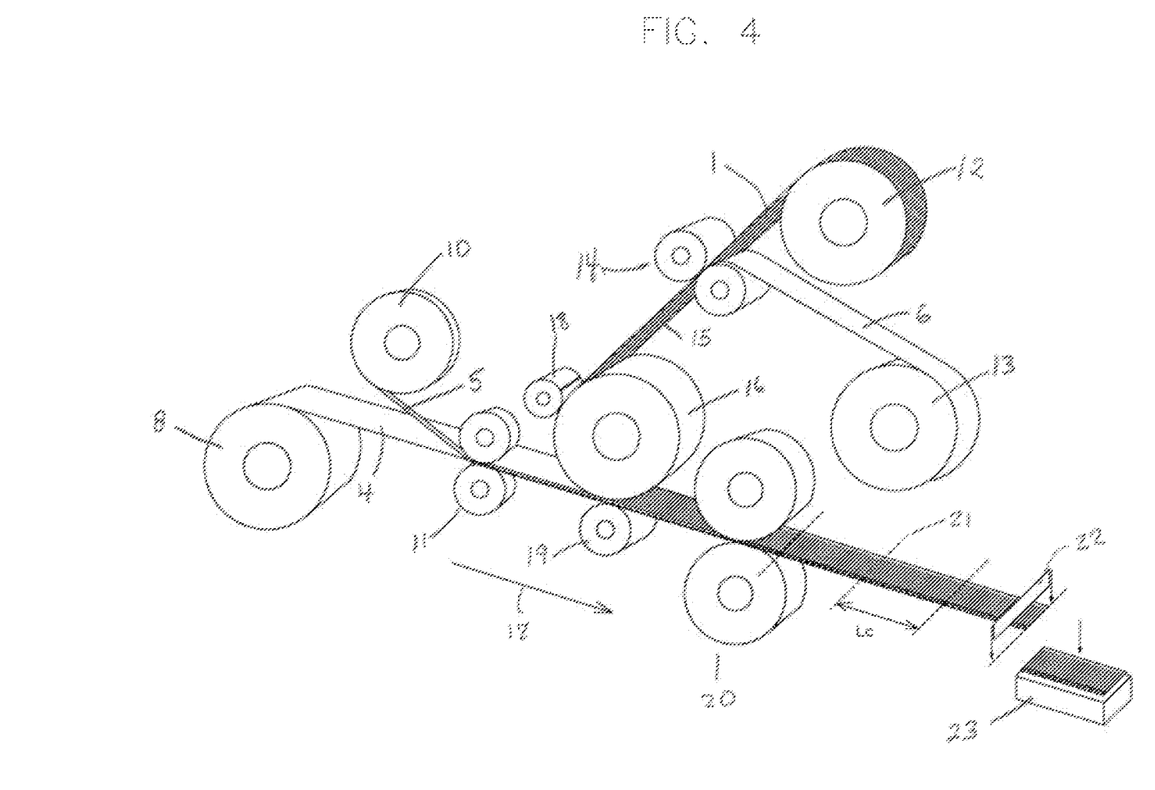
FIG. 4 is a perspective schematic diagram illustrating the fundamental steps in a process or method for automatically converting reels of flexible solar cell material into finished cells using a flat expanded metallic mesh conductor.

FIG. 4 is a perspective schematic side view of a system for the automated steps used to convert a reel of flexible solar cell material into individual photovoltaic cells. These steps may be referred to as a roll-to-cell or RTC conversion. The diagram is not to scale and is meant only to illustrate the basic concepts, rather than to describe an actual embodiment of those concepts in a functional RTC machine.

A reel (or roll) 8 of a photovoltaic device 4 that can come from the slitting operation of FIG. 3 (or any other operation for preparing the reel 8) is brought in contact with other material for forming a solar cell. A roll 10 of transparent edge insulating strip 5 is continuously fed to a small set of rollers 11 (e.g., nip rollers) to apply the strip to one edge of the device 4. The rollers can apply pressure for a PSA material and/or they can be heated for a thermal set material. Pressure and/or heating can aid the insulating strip 5 to come in contact with (and in some cases adhere to) the device 4 material from the reel 8. Expanded metallic mesh 1 can be fed from roll 12 and transparent tape 6 can be fed from roll 13 into rollers 14. This operation can affix the mesh 1 to the tape 6, in some cases only securely enough for it to be handled as a unit of joined material 15. The joined tape and mesh 15 proceed toward vacuum drum 16 which can be rotating at an edge speed that is synchronous with the device 4 (along the reel 8) and in the direction of arrow 17. The rollers 14 can advance the tape/mesh joined material 15 at a slightly lower speed, so that initially the joined material 15 is slightly on vacuum drum 16.

Figure 5:
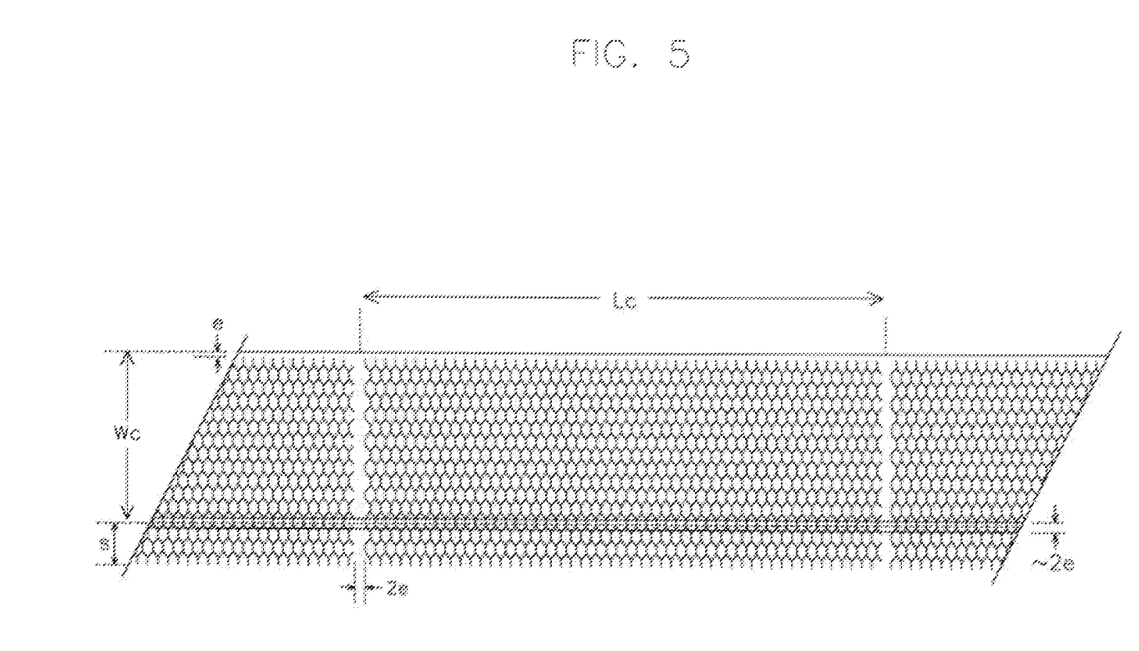
FIG. 5 is a schematic view of a segment of the strip of solar cells after the lamination step described in FIG. 4 showing how the expanded metallic mesh is applied to the cell with blank areas created for cutting the strip into individual solar cells.

Next, the joined material 15 is brought adjacent to a cutting member 18, which can be a rotary cutting member (e.g., rotary knife, rotary blade). The cutting member 18 can cut the joined material 15 along a selected length. The length can be a function of the size of the cutting member 18. In cases in which the cutting member 18 is a rotary cutting member, the cutting member cuts the joined material 15 at $2*\pi*r$ intervals, where "r" is the radius of the rotary cutting member. Cut pieces of joined material 15 sequentially proceed around drum 16 at a speed that is in-line with the rotational speed of the drum 16. The speed can be suitable for initial affixing to the cut joined material 15 to the device 4 material and insulating strip 5. A pressure roller 19 downstream of the drum 16 can aid in bringing the cut joined material 15 in contact with the device 4 material and insulating strip 5. Final lamination of the cut joined material 15 to the device 4 material and insulating strip 5 can be performed with the aid of rollers 20. The small difference in speed between the rollers 14 and vacuum drum 16 can create a small (adjustable) gap between each piece of cut joined material 15 when it is attached to the device 4 and insulating strip 5. The gap areas are indicated by dashed lines 21, and a photovoltaic cell length Lc is the distance from the center of one gap to the center of the next gap. A cutting member 22 downstream of the rollers 20 can cut the finished strip of nascent photovoltaic cell into individual photovoltaic cells at the center of each gap. The cutting member 22 can include a vision or other indexing system that can operate a guillotine knife, such as, for example, a robotic vision system. The photovoltaic cells can then be accumulated in a cassette or bin 23. FIG. 5 illustrates an enlarged view of a section of the cell strip in the region of Lc in FIG. 4. Cutting the material in the center of the gaps (e.g., having a width of about 2e) can produce photovoltaic cells as described elsewhere herein, such as the photovoltaic cell described in the context of FIGS. 2a and 2b.

The mesh 1 can be coated with other materials. For instance the side that is joined to the top of the photovoltaic device 4 can have a thin layer of low temperature melting solder, which can be pre-applied to the mesh 1. One such candidate might be an indium/tin eutectic that melts at about 118° C. In this case, rollers 20 of FIG. 4 can run at an elevated temperature to melt the solder as the tape/mesh is laminated to the photovoltaic device 4. A tape with appropriate temperature resistance would have to be used in this method. Alternatively, a thin layer of conductive epoxy could be applied by roller transfer to the mesh between nip rollers 14 and vacuum drum 16 of FIG. 4 to provide a more rigid bond between the mesh and the photovoltaic device 4 after lamination. Other possible alternatives would occur to those skilled in the art.

Figure 6:
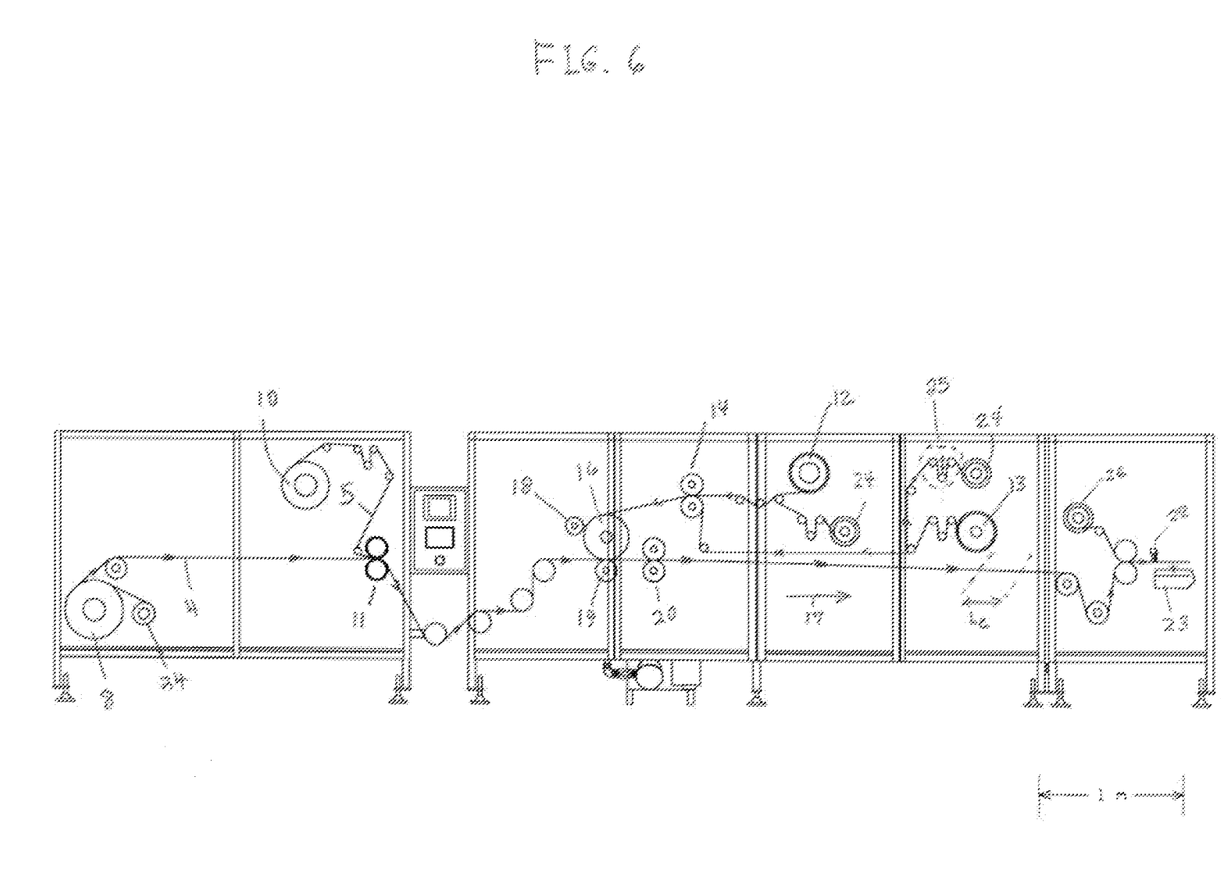
FIG. 6 is a schematic diagram, drawn approximately to scale, showing a cross sectional view of a machine utilizing the fundamental methods described in FIG. 4 for forming single solar cells from reels of flexible solar cell material and rolls of expanded metallic mesh.

FIG. 6 is a schematic cross sectional side view of a system for forming individual solar cells from rolls of cell material. In some cases, a roll of material may have properties that can require an interleaf of a different material to prevent sticking or substance transfer. In FIG. 6, rollers for accumulating possible interleaf material are provided for rolls 8, 12, and 13. They are all labeled as 24. The interleaf material can aid in preventing one material from sticking to another material. In order to control the tension in a strip, a so called "dancer" can be employed in the handling system. Danvers can be used in a number of places. One such location is identified as the trio of small rollers 25 where the action of the dancer is suggested by the double headed arrow. Other rollers can be used for handling, directing, and guiding a strip through the system. In the illustrated example, a space is provided between input roll 8 and tape roll 10 for the addition of an apparatus to buff the slit edge of the solar cell strip to remove shunts if that may be a problem caused by the slitting operation. A roll of interleaf material 26 can be used to provide separation between the cells in cassette 23, if required.

The system of FIG. 6 includes a plurality of processing modules, which may be mounted adjacent one another to form a roller-implemented system. The processing modules can be mounted to form a housing having the roller-implemented system. The housing can be evacuated (e.g., with the aid of a pumping system) or maintained under an inert atmosphere, such as under an atmosphere of Ar or He. In the illustrated example, the processing modules each have a width of about 1 meter.

Before individual photovoltaic cells are built into strings and mounted to form a solar cell module, they can be tested for performance and graded into bins of similar current (or power) output. Standard commercially available robotics can be used for manipulating cells in such operations.

In some embodiments, a method for forming a photovoltaic module comprises providing a first photovoltaic cell and a second photovoltaic cell. An individual photovoltaic cell of the first and second photovoltaic cells comprises (i) an expanded metallic mesh that is disposed adjacent to a flexible thin film photovoltaic device, and (ii) an electrically insulating material disposed between the expanded metallic mesh and the thin film photovoltaic device at an edge portion of the flexible thin film photovoltaic device. Next, an expanded metallic mesh of the first photovoltaic cell is brought in contact with an underside of the second photovoltaic cell, thereby electrically connecting the thin film photovoltaic devices of the photovoltaic devices to form the photovoltaic module.

Figure 7A:
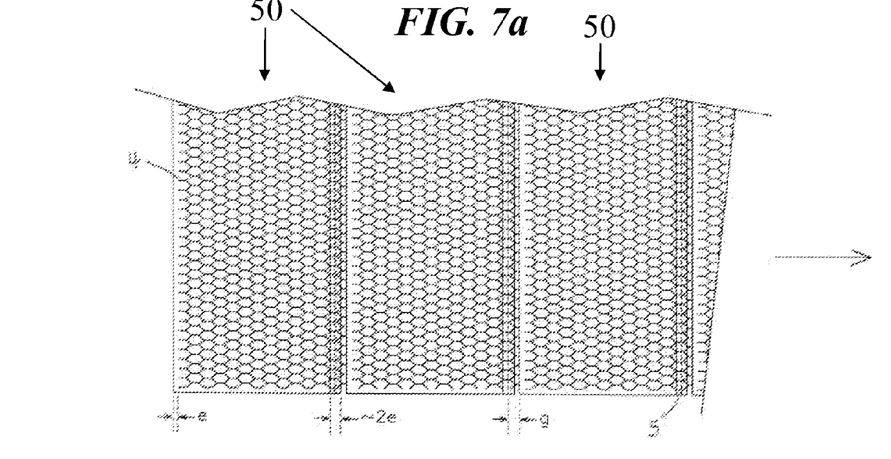
FIG. 7a is a schematic planar view showing the serial interconnection of the flexible solar cells made by the automated methods described in the present invention.

Individual photovoltaic cells formed according to methods described elsewhere herein can be mounted in a side-by-side configuration and interconnected to form a photovoltaic (solar) cell module. FIG. 7a is a schematic planar view from the light (e.g., sun) facing side of a portion of a long interconnected string of flexible photovoltaic cells 50. Each photovoltaic cell can include a mesh 1, photovoltaic device 4, and insulating strip 5. The photovoltaic cells 50 can be created using systems and methods described elsewhere herein. Individual photovoltaic cells 5—are separated by a gap (g). The gap can be on the order of a millimeter or less depending on the accuracy that can be achieved with the robotic system that picks the cells 50 from a carrier cassette and places them one beside the other. These strings of flexible cells 50 can advantageously suffer less area loss between cells 50 than their silicon counterparts because the Z-tab interconnect in that technology may requires more distance to allowed for thermal expansion stresses encountered during use. The reduction in module area loss according to cells of this disclosure can be at least about 1%, 2%, 3%, 4%, 5%, 10%, 20%, 30%, or 40% compared to standard silicon cell technology. In an example, the reduction in module area loss according to cells of this disclosure can be as much as about 10%. This is a significant economic advantage.

Figure 7B:
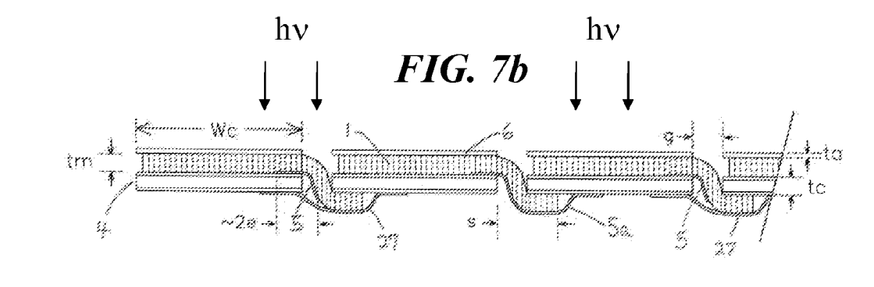
FIG. 7b shows a cross-sectional view of the serial interconnection of the flexible solar cells made by the automated methods described in the present invention.

FIG. 7b is a schematic cross-sectional side view of the portion of interconnected cells 50 of FIG. 7a. Two slightly different examples of cell interconnection are shown in FIG. 7b.

In an example, a second cell is placed on an overhang region s of mesh 1 of a first cell with a gap g between the cells. A relatively wide strip of a coupling member (e.g., PSA) 27 holds the two cells together and in registration with an electrical connection between the mesh of the first cell and a back portion (e.g., portion facing away from light) of the second cell. The insulating strip 5 prevents the edge of the first cell from coming in contact with (and, e.g., being shunted by) the bent over mesh. In some cases, the insulating strip 5 prevents the mesh 1 from shorting a top (light receiving) portion of a cell 4 with a bottom portion of the cell, such as when adjacent cells 4 are brought laterally towards one another to form a photovoltaic module. Strings of cells of a given length can be made in such fashion, and because of their connection, they can be handled as a unit. Next the strings are placed together, interconnected with conductive ribbon leads, fitted with appropriate thin-film diodes, and laminated into a finished module.

In another example, edge insulating strip 5 can be replaced by a wider strip 5a as shown in the figure. The strip 5 in such configuration can be precluded. This wider tape 5a can be accommodated on roll 10 of the reel to cell description in FIGS. 4 and 6 and it can require an interleaf material. This tape can have adhesive substantially covering the side facing the mesh 1, but can require adhesive on the opposite side only in the region (width of approximately e) where it can be attached to cell 50. As such, the coupling member 27 can be eliminated with savings in material and cost. However, in the cell formation process, interleaf material from roll 26 in FIG. 6 can be required to prevent the cells 50 from sticking together as they are stacked in cassette 23. The strings of cells are assembled into modules as previously described.

A photovoltaic module can include several strings of individual photovoltaic cells, at least some of which are connected in a serial configuration. In the case of relatively large cells, such as silicon, the strings are connected serially to raise the overall voltage of the photovoltaic module—that is, the voltage of the photovoltaic module is approximately equal to the sum of the voltages of individual cells of the photovoltaic module that are in a serial configuration. In situations in which strings of photovoltaic cells are employed, with a single string comprising a plurality of serially connected photovoltaic cells, the top conductor of a first cell at the end of one solar cell string can be connected to the back conductor of a second cell at the end of a second photovoltaic string. The use of an expanded mesh can allow a particularly advantageous method of making this string to string connection.

Figure 8A:
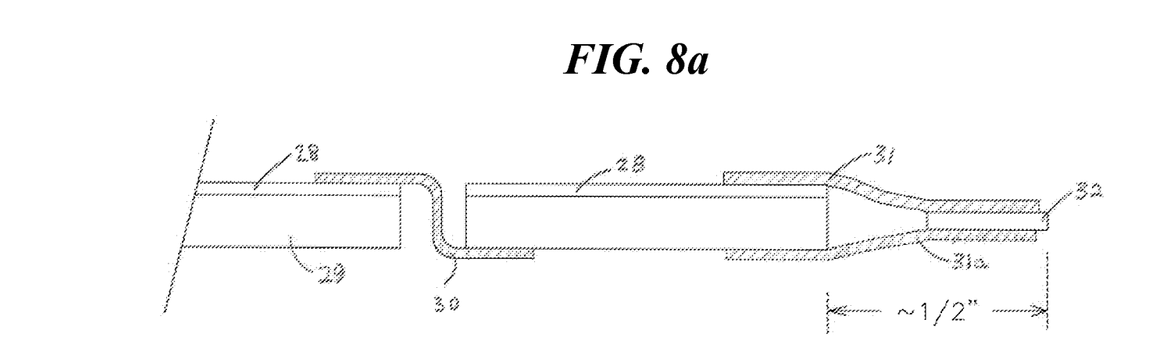
FIG. 8a is a schematic cross-sectional view of 2 silicon cells at the end of a string illustrating the typical Z-tab method of connecting the cells together serially and the way the end cell is connected to the conducting ribbon used to interconnect strings of cells.

In some cases, in order to connect two strings of cells in series, the back of one cell at the end of one string can be connected to the top mesh conductor of a cell at the end of the other string. In modules using silicon cells, this can be accomplished with Z-tab material that extends from the back of a cell, or from the buss bars on a cell, to an external conducting ribbon that is on the order of ¼ inch wide. FIG. 8a is a schematic cross-sectional illustration in exaggerated scale of a typical silicon connection. The buss bar 28 of silicon-based photovoltaic cell 29 is connected to the back of an adjacent silicon-based photovoltaic cell by Z-tab 30. At the last cell, Z-tab like material 31 connects the buss bar 28 to a conducting ribbon 32, or it connects the back of the cell to the ribbon, as shown as the bottom dashed connector 31a, depending upon which is needed for serial connection of the strings. The region of the module occupied by this structure can have a width of about half inches or more, as indicated. It can extend across both the top and bottom edges of the module, in some cases reducing the effective photovoltaic area that may be exposed to light, thus significantly reducing the module aperture efficiency.

Figure 8B:
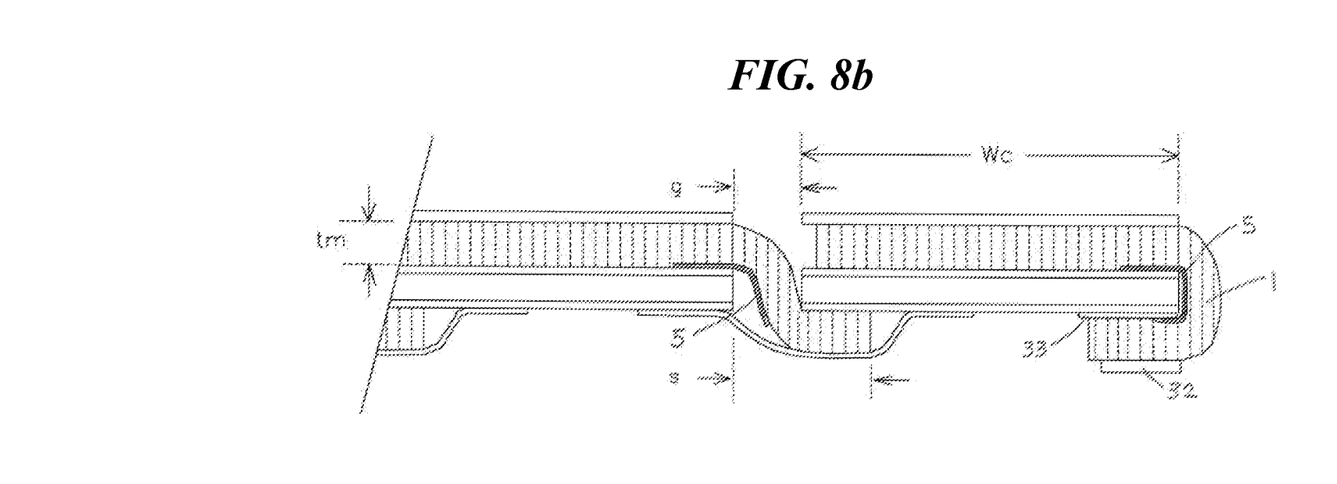
FIG. 8b is a schematic cross-sectional view of flexible cells at the end of a string illustrating the improved method of connecting serially the end of one string to the end of a second string.

In contrast, mesh interconnections of the disclosure can permit a relatively simple and efficient way of forming photovoltaic string interconnects that do not significantly sacrifice aperture efficiency. FIG. 8b shows an expanded cross-sectional side view of interconnected flexible photovoltaic cells. The photovoltaic cells that are not at the end of the string of cells can be interconnected in the manner described in FIG. 7. In order to make a connection from the overhanging mesh 1 of one cell 4 to the back of a cell at the end of the next string, a sufficiently wide coupling member (e.g., insulating PSA strip) 33 can be applied along the edge of the cell 4. Next, the overhanging region of the mesh 1 and a part of insulating strip 5 can be folded around the edge of the cell 4 and over the back side. The mesh 1 can be prevented from shorting with the metal foil substrate of the cell 1 by coupling member 33. The conducting ribbon 32 can then be connected only to the mesh at the end of the string, thereby avoiding any shorting. The ribbon can serially connect to the end of the next string along the edge of the cell that does not have the overhanging mesh. In some examples, mesh 1 and insulating strip 5 are only a few thousandths of an inch thick. In such a case, there can be practically no aperture loss along the edges of the module where the string interconnections are made, because they are hidden behind the cells. This approach can result in a significant gain in aperture efficiency of the thin film solar cell module compared to a silicon-based cell module (see, e.g., FIG. 8a).

Photovoltaic modules of the disclosure can be electrically coupled to one another in series, in parallel, or both. In some examples, photovoltaic modules are connected in series. For example, a positive terminal of one photovoltaic module can be connected to a negative terminal of another photovoltaic module. In other examples, photovoltaic modules are connected in parallel. For example, a positive terminal of one photovoltaic module can be connected to a positive terminal of another photovoltaic module, or a negative terminal of one photovoltaic module can be connected to a negative terminal of another photovoltaic module.

Systems and methods provided herein may be combined with or modified by other systems and methods, such as, for example, systems and methods provided in U.S. Patent Publication No. 2011/0300661 ("SOLAR CELL INTER- CONNECTION METHOD USING A FLAT METALLIC MESH"), which is entirely incorporated herein by reference.

It should be understood from the foregoing that, while particular implementations have been illustrated and described, various modifications can be made thereto and are contemplated herein. It is also not intended that the invention be limited by the specific examples provided within the specification. While the invention has been described with reference to the aforementioned specification, the descriptions and illustrations of the preferable embodiments herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents. It is intended that the following claims define the scope of the invention and that methods and structures within the scope of these claims and their equivalents be covered thereby.

What is claimed is:

1. A method for forming photovoltaic cells, comprising:
   (a) providing a first roll of a photovoltaic material and a second roll of an expanded metallic mesh, wherein the photovoltaic material comprises a photoactive material adjacent to a flexible substrate, and wherein the expanded metallic mesh comprises a plurality of openings;
   (b) providing an electrically insulating material adjacent to an edge portion of the photovoltaic material;
   (c) directing the photovoltaic material from the first roll and the expanded metallic mesh from the second roll into a vacuum drum and pressing the photovoltaic material against the expanded metallic mesh to form a nascent photovoltaic cell, wherein the electrically insulating material is disposed between the expanded metallic mesh and the photovoltaic material; and
   (d) cutting the nascent photovoltaic cell into individual sections to form a plurality of photovoltaic cells.

2. The method of claim 1, wherein providing the electrically insulating material in (b) comprises bringing the electrically insulating material from a third roll in contact with the photovoltaic material from the first roll.

3. The method of claim 2, wherein (c) further comprises joining a securing member from a fourth roll to the expanded metallic mesh, wherein the securing member secures the expanded metallic mesh against the photovoltaic material.

4. The method of claim 1, wherein (c) further comprises cutting the expanded metallic mesh into individual sections prior to pressing the photovoltaic material against the expanded metallic mesh.

* * * * *